United States Patent [19]

Matsuura

[11] Patent Number: 5,721,156
[45] Date of Patent: *Feb. 24, 1998

[54] METHOD OF MANUFACTURING A SEMICONDUCTOR DEVICE WITH A PLANARIZED INTEGRATED CIRCUIT

[75] Inventor: Masazumi Matsuura, Hyogen-ken, Japan

[73] Assignee: Mitsubishi Denki Kabushiki Kaisha, Tokyo, Japan

[*] Notice: The term of this patent shall not extend beyond the expiration date of Pat. No. 5,459,105.

[21] Appl. No.: 538,324

[22] Filed: Oct. 3, 1995

Related U.S. Application Data

[62] Division of Ser. No. 223,192, Apr. 5, 1994, Pat. No. 5,459,105, which is a division of Ser. No. 781,342, Oct. 25, 1991, Pat. No. 5,319,247.

[30] Foreign Application Priority Data

Oct. 30, 1990 [JP] Japan ................. 2-294423

[51] Int. Cl.$^6$ ................. H01L 21/316
[52] U.S. Cl. ................. 437/195; 437/228; 437/238
[58] Field of Search ................. 437/235, 238, 437/228, 231, 195

[56] References Cited

U.S. PATENT DOCUMENTS

| | | |
|---|---|---|
| 4,775,550 | 10/1988 | Chu et al. |
| 4,872,047 | 10/1989 | Wang et al. ............ 156/643 |
| 4,894,351 | 1/1990 | Batty. |
| 4,962,063 | 10/1990 | Maydan et al. |
| 4,965,226 | 10/1990 | Gootzen et al. ............ 437/189 |
| 4,972,251 | 11/1990 | Lehrer. |
| 4,983,546 | 1/1991 | Hyun et al. |
| 5,079,188 | 1/1992 | Kawai ............ 437/195 |
| 5,204,288 | 4/1993 | Marks et al. ............ 437/228 |
| 5,250,472 | 10/1993 | Chen et al. |
| 5,252,515 | 10/1993 | Tsai et al. |
| 5,312,512 | 5/1994 | Allnan et al. |
| 5,384,288 | 1/1995 | Ying ............ 437/228 |
| 5,393,708 | 2/1995 | Hsai et al. |
| 5,403,780 | 4/1995 | Jain et al. |
| 5,514,624 | 5/1996 | Morozumi ............ 437/238 |

FOREIGN PATENT DOCUMENTS

| | | |
|---|---|---|
| 1-18594 | 7/1989 | Japan. |
| 2-260534 | 10/1990 | Japan. |

OTHER PUBLICATIONS

Wolf, Stanley, "Silicon Processing for the VLSI Era", vol. 2, pp. 181, 188–189, 196, 275.

"Planar Technique for Sub–Micron Device," *Semicon News*, 1989.6 (Special issue).

K. Futino, "Silicon Dioxide Deposition by Atmospheric Pressure and Low Temperature CVD . . . Ozone," *J. of Electrochemical Soc.*, vol. 137, No. 9, Sep. 1990, pp. 2883–2887.

(List continued on next page.)

*Primary Examiner*—Charles L. Bowers, Jr.
*Assistant Examiner*—Matthew Whipple
*Attorney, Agent, or Firm*—Lowe, Price, LeBlanc & Becker

[57] ABSTRACT

A method of manufacturing a semiconductor device having a flat surface and an interlayer insulating film having superior crack resistance is disclosed. A first silicon oxide film having a superior crack resistance is formed on a semiconductor substrate so as to cover the surface of a stepped pattern. A second silicon oxide film having a superior step coverage is deposited on the above-mentioned first silicon oxide film so as to fill the recessed portions of the stepped pattern and to cover the stepped pattern. The above-described second silicon oxide film is etched to a prescribed thickness. A third silicon oxide film superior in filling of recesses is placed into the recessed portions existing on the surface of the above-described second silicon oxide film after its etching. A fourth silicon oxide film is formed on the semiconductor substrate including the above-described second silicon oxide film and third silicon oxide film.

27 Claims, 7 Drawing Sheets

OTHER PUBLICATIONS

Kenzo Matsuda and Keizo Sakiyama, "Planar Technique for Sub–Micron Device Planar Technique by Complex Process," *Semicon News* (Special Issue), Jun. 1989, pp. 62–67.

"Dielectric Film Deposition by Atmospheric Pressure and Low Temperature CVD Using TEOS, Ozone and New Organometallic Doping Sources," Nishimoto et al., Jun. 1989, VMIC Conference, IEEE, pp. 382–389.

"A Single–pass, In–Suit Planarization Process Utilizing TEOS for Double–poly, Double–metal CMOS Technologies," Mehta et al., Jun. 1989 VMIC Conference, IEEE, pp. 80–88.

"Low–temperature APCVD Oxide Using TEOS–ozone Chemistry for Multilevel Interconnections," Kotani et al., LSI Research and Development Laboratory, Mitsubishi Electric Corporation, pp. 28.2.1–28.2.4.

"Plasma TEOS Process for Interlayer Dielectric Application," by B.L. Chin et al., Solid State Technnology, Apr. 1988, pp. 119–122.

"Low–Temperature APCVD Oxide Using TEOS–Ozone Chemistry for Multilevel Interconnections," by H. Kotani et al., International Electron Devices Meeting, 1989, pp. 669–672.

"Comparison of Phosphosilicate Glass Films Deposited by Three Different Chemical Vapor Deposition Methods," by Toshimi Shioya et al., J. Electrochem. Soc.: Solid–State Science and Technology, Sep. 1986, vol. 133, No. 9, pp. 1943–1950.

"Stress in Silicon Dioxide Films Deposited Using Chemical Vapor Deposition Techniques and the Effect of Annealing On These Stresses," by Bharat Bhushan et al., J. Vac. Sci. Technol. B 8 (5), Sep./Oct. 1990, pp. 1068–1074.

"Process Reliability Considerations of Planarization with Spin–on–Glass," by Yosi Shacham–Diamond, J. Electrochem. Soc., vol. 137, No. 1, Jan. 1990, pp. 190–196.

"Water–Related Degradation of Contacts in the Multilevel MOS IC with Spin–on Glasses as Interlevel Dielectrics," by N. Lifshitz et al., IEEE Electron Devices Letters, vol. 10, No. 12, Dec. 1989, pp. 562–564.

"Application of Surface Reformed Thick Spin–on–Glass to MOS Device Planarization," by Shinichi Ito et al., J. Electrochem. Soc., vol. 137, No. 4, Apr. 1990, pp. 1212–1218.

Kawai et al., "Interlayered Dielectric Planarization with TEOS–CVD and SOG," Proceedings of the Fifth Internation IEEE VLSI Multilevel Interconnection Conference, Santa Clara, Jun. 13 to 14, 1988, pp. 419 to 425.

METHOD OF MANUFACTURING A SEMICONDUCTOR DEVICE WITH A PLANARIZED INTEGRATED CIRCUIT

This application is a division of application Ser. No. 08/223,192, U.S. Pat. No. 5,459,105, which is a division of application Ser. No. 07/781,342 filed Oct. 25, 1991, U.S. Pat. No. 5,319,247.

BACKGROUND OF THE INVENTION

1. Field of the Invention

The present invention relates generally to a semiconductor device, and more specifically to a semiconductor device including an interlayer insulating film having higher crack resistance and insulation. The present invention further relates to a method of manufacturing such a device.

2. Description of the Background Art

Recently, in the field of manufacturing large scale integrated circuit devices (hereinafter referred to as LSI devices), mass production of 4M bit DRAMs has been practiced on a full scale. Miniaturizing LSI devices requires miniaturization of interconnection widths, interconnection spaces, etc., resulting in increase in steps formed on the surface of a substrate. The increase of steps formed on the surface of the substrate results in the following problems. Referring to FIG. 7, a first interconnection pattern 52 is provided on a substrate 51. The first interconnection pattern 52 has a number of stepped portions 52a. An interlayer insulating film 53 is provided covering the first interconnection pattern 52.

Affected by the stepped portions 52a of the first interconnection pattern 52, the surface of the interlayer insulating film 53 is unevenly shaped. Forming a second interconnection pattern 54 on the unevenly shaped surface of the interlayer insulating film 53 gives rise to formation of a narrow portion 54A to the second interconnection patter 54. The narrow portion A can result in disconnection. Also, patterning does not proceed in an accurate manner in forming the second interconnection pattern 54, with the surface of the interlayer insulating film 53 being unevenly shaped. Consequently, the residue of material forming the interconnection pattern remains in areas other than intended, resulting in shorting.

Various planar techniques have been proposed for flattening interlayer insulating films in order to solve this problem. However, no definitely effective and efficient process has been discovered yet at present.

FIGS. 6A–6C are sectional views showing a conventional process of a planar technique for flattening interlayer insulating films (Semicon News June, 1989).

Referring to FIG. 6A, a semiconductor substrate 1 having a stepped pattern 2. A silicon oxide film 3 (hereinafter plasma oxide film 3) is formed to cover the surface of the stepped pattern 2 by plasma chemical vapor deposition (hereinafter plasma CVD). The thickness of the plasma oxide film 3 is between about 0.1–0.3 µm. The plasma oxide film 3 is formed using silane ($SiH_4$)/nitrous oxide ($N_2O$) or tetra-ethyl-ortho-silicate (TEOS)/oxygen $O_2$ as a material gas. The plasma oxide film 3 is superior in insulation and crack resistance, but on the other hand is inferior in step coverage and filling of recesses.

Referring to FIG. 6B, a silicon oxide film 4 (hereinafter atmospheric pressure TEOS oxide film 4) is deposited by atmospheric pressure CVD using TEOS/ozone ($O_3$), so as to cover the stepped pattern 2, filling up the recesses of the stepped pattern 2. The atmospheric pressure TEOS oxide film 4 has a thickness in the range of approximately 0.6–0.8 µm in the step 2a of the stepped pattern 2. The plasma oxide film 3 plus the atmospheric pressure TEOS oxide film 4 equals approximately 0.9 µm in film thickness.

Referring to FIG. 6C, a spin on glass film 5 (hereinafter SOG film 5) is applied onto the atmospheric pressure TEOS oxide film 4 so as to fill up recess 4a existing on the surface of the atmospheric pressure TEOS oxide film 4 and to cover the atmospheric TEOS oxide film 4, and annealing is performed thereon. Thereafter, the SOG film 5 is etched in such a manner that the SOG film 5 remains only in the recess 4a of the atmospheric pressure TEOS oxide film 4. A three-layer structured interlayer insulating film 24 is thus formed on the semiconductor substrate 1.

The manufacturing process of a conventional interlayer insulating film is composed as described above. The plasma oxide film 3 formed by the above-mentioned method is superior in insulation and crack resistance compared to the atmospheric TEOS oxide film 4. The plasma oxide film 3 does not easily change its film characteristics by heat-treatment. Even with the difference in shrinkage factors between the stepped pattern 2 (an aluminum interconnection which is an underlying step) and the atmospheric pressure TEOS oxide film 4, cracks in the atmospheric pressure TEOS oxide film 4 due to the difference can be prevented by using the plasma oxide film 3 as the underlying film of the atmospheric pressure TEOS oxide film 4.

The atmospheric pressure TEOS oxide film 4 is superior in step coverage and filling of recesses. The atmospheric pressure TEOS oxide film 4 fills up very small trenches completely which may produce voids if the plasma oxide film 3 is used.

Neither the plasma oxide film 3 nor the atmospheric pressure TEOS oxide film 4 is independently suitable as an interlayer insulating film. The combination of these two kinds of films permits the advantages of these films to be united, thereby forming a superior interlayer insulating film.

In the above conventional example, referring to FIG. 6C, the interlayer insulating film is not flat enough at a wide trench 2a, and, therefore, the SOG film 5 fills the recess 4a of the atmospheric pressure TEOS oxide film 4. The flatness of the surface of the interlayer insulating film is improved by filling the recesses 4a with the SOG film 5.

In the conventional interlayer insulating film thus structured, referring to FIG. 6C, cracks are produced in the SOG film 5 or the atmospheric pressure TEOS oxide film 4 in the process of annealing the SOG film 5 formed last, or in a subsequent heat treatment process, because of the difference in shrinkage factors between the SOG film 5 and the atmospheric pressure TEOS oxide film 4.

The cracks produced in the SOG film 5 and atomospheric TEOS oxide film 4 cause the problems as below.

Referring to FIG. 8, with a crack 60 formed in the SOG film 5 and TEOS oxide film 4, Al enters the crack 60 at the time of sputtering for forming a second Al interconnection 25.

Also, if the crack 60 is too large, the second Al interconnection 25 is formed with a part disconnected as shown in FIG. 8. The residue left behind at the time of etching the second Al interconnection 25 remains along the crack 60, causing shorting.

SUMMARY OF THE INVENTION

It is therefore an object of the present invention to provide a semiconductor device including an interlayer insulating film having its surface flattened.

Another object of the present invention is to provide a semiconductor device including an interlayer insulating film having higher crack resistance and insulation.

Yet another object of the present invention is to provide a semiconductor device in which the crack resistance and insulation of an interlayer insulating film is not deteriorated due to heat treatment.

Still another object of the present invention is to provide a method of manufacturing a semiconductor device including an interlayer insulating film having higher crack resistance and insulation.

A semiconductor device in accordance with the present invention includes a semiconductor substrate, and a stepped pattern formed on the semiconductor substrate. A first silicon oxide film superior in crack resistance is formed on the semiconductor substrate so as to cover the surface of the stepped pattern. A second silicon oxide film superior in step coverage is deposited on the first silicon oxide film so as to fill up the recesses existing on the surface of the first silicon oxide film, covering the stepped pattern. A third silicon oxide film superior in filling of recesses fills the recesses existing on the surface of the second silicon oxide film in order to flatten the surface of the second silicon oxide film. A fourth silicon oxide film is formed on the semiconductor substrate including the above-mentioned second and third silicon oxide films.

In one preferred embodiment of a semiconductor device in accordance with the present invention, the first silicon oxide film is formed by plasma CVD. The second silicon oxide film is formed by atmospheric pressure CVD, using an organic silicon and ozone and an alkoxyl group. The third silicon oxide film is formed by applying a spin on glass film thereon.

In a method of manufacturing the semiconductor device in accordance with another aspect of the present invention, first, a stepped pattern is formed on a semiconductor substrate. A first silicon oxide film having superior crack resistance is formed on the semiconductor substrate so as to cover the surface of the stepped pattern. A second silicon oxide film having superior step coverage is deposited over the first silicon oxide film so as to fill up the recesses of the stepped pattern, covering the stepped pattern. The second silicon oxide film is then etched to attain a prescribed film thickness. A third silicon oxide film superior in filling of recesses fills the recesses on the surface of the etched second silicon oxide film. A fourth silicon oxide film is formed on the semiconductor substrate including the second silicon oxide film and the third silicon oxide film.

Another preferred embodiment of a manufacturing method of a semiconductor device in accordance with another aspect of the present invention, the formation of the first silicon oxide film is performed by plasma CVD. The formation of the second silicon oxide film is performed by atmospheric pressure CVD, using organic silicon and ozone and an alkoxyl group. The third silicon oxide film is formed by applying a spin on glass film onto the semiconductor substrate.

In a semiconductor device in accordance with the present invention, an interlayer insulating film includes a first silicon oxide film having superior crack resistance provided so as to cover the surface of a stepped pattern, and a second silicon oxide film having superior step coverage provided on the first silicon oxide film. Further, a third silicon oxide film superior in filling of recesses fills recesses existing on the surface of the second silicon oxide film. A fourth silicon oxide film is provided so as to cover the second silicon oxide film and the third silicon oxide film. With the interlayer insulating film being in a multilayered structure having silicon oxide films with different characteristics as described above, the advantages provided by the respective silicon oxide films are coupled with each other. As a result, the surface of the interlayer insulating film is flattened, and the interlayer insulating film attains superior crack resistance.

In a method of manufacturing a semiconductor device in accordance with another aspect of the present invention, a first silicon oxide film having superior crack resistance covers the surface of a stepped pattern. Then, a second silicon oxide film having superior step coverage is deposited over the first silicon oxide film so as to fill up the recesses of the stepped pattern as well as to cover the stepped pattern.

Then, the second silicon oxide film is etched to attain a prescribed thickness. The second silicon oxide film is on one hand advantageous with superior step coverage, but on the other hand disadvantageous with inferior crack resistance. The above-described etching treatment allows the thickness of the second silicon oxide film to be thin, so that the disadvantage can be suppressed as much as possible.

Subsequently, a third silicon oxide film having superior in filling of recesses fills the recesses existing on the surface of second silicon oxide film. The surface of the obtained layered films is thus flattened.

A fourth silicon oxide film is then formed on the surface of the flattened layered films.

Formed as described above, the interlayer insulating film has its surface flattened and is superior in crack resistance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
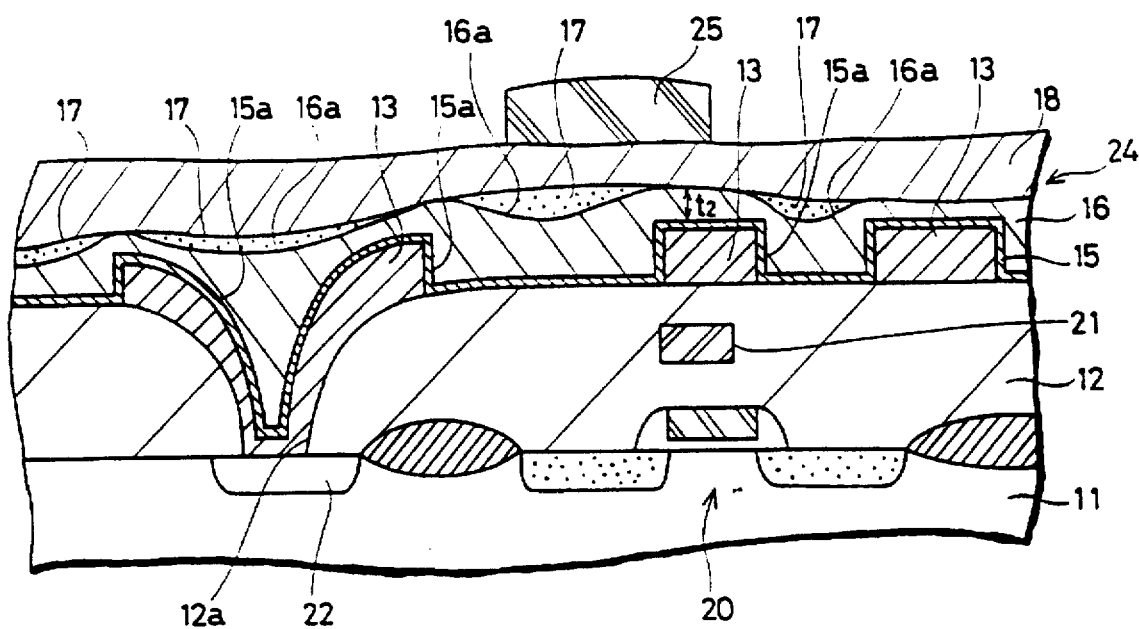
FIG. 1 is a sectional view showing a semiconductor device in accordance with one embodiment of the present invention.

Now, description will be given on the preferred embodiments of the present invention in conjunction with the drawings. FIG. 1 is a sectional view showing a semiconductor device in accordance with the present invention.

A transistor 20 is formed on a semiconductor substrate 11 (a silicon semiconductor substrate). An insulating film 12 is provided so as to cover the transistor 20. Placed in the insulating film 12 is a bit line 21. A contact hole 12a for exposing the junction 22 of the semiconductor substrate 11 is formed in the insulating film 12. A stepped pattern 13, formed of a first Al interconnection is formed on the interlayer insulating film 12. The stepped pattern 13 is partially buried inside the contact hole 12a, so as to be connected to the junction 22 of the semiconductor substrate 11. The first Al interconnection is for connecting the bit lines.

A first silicon oxide film 15 (hereinafter a plasma oxide film 15) having superior crack resistance is formed on the semiconductor substrate 11 so as to cover the surface of the stepped pattern 13. The plasma oxide film 15 is formed by plasma CVD, using $SiH_4/N_2O$ or $TEOS/O_2$ as a material gas, which will be described later on. The thickness of the plasma oxide film 15 is about in the range of 0.1–0.2 μm. A silicon oxide film formed by plasma CVD has few SiOH bonds, and has superior insulation as well as crack resistance.

A second silicon oxide film 16 (hereinafter referred to as an atmospheric pressure TEOS oxide film 16) having superior step coverage is provided on the plasma oxide film 15 so as to fill up recesses 15a existing on the surface thereof and to cover the stepped pattern 13. The atmospheric pressure TEOS oxide film 16, as will be described later, is formed by atmospheric CVD, using TEOS and ozone. The thickness ($t_2$) of the atmospheric pressure TEOS oxide film 16 is less than 0.5 μm and preferably not more than 0.2 μm in the recesses of the stepped pattern 13. A silicon oxide film formed by atmospheric pressure CVD includes more SiOH bonds than the plasma oxide film 15, and, as will be described later, is superior in step coverage as well as filling of recesses. The silicon oxide film is however, disadvantageous because of its inferiority in insulation and crack resistance. But if the film thickness $t_2$ is less than 0.5 μm and preferably not more than 0.2 μm, the inferiority in crack resistance is overcome.

A silicon oxide film 17 (hereinafter SOG film 17) superior in filling of recesses is provided in concaves 16a existing on the surface of the atmospheric pressure TEOS oxide film 16, in order to flatten the surface of the atmospheric pressure TEOS oxide film 16. The SOG film 17 has more SiOH bonds than the atmospheric pressure TEOS oxide film 16 and is superior in filling of recesses.

A fourth silicon oxide film, i.e. a plasma oxide film 18 is formed so as to cover the surface of the SOG film 17 and the atmospheric pressure TEOS oxide film 16. The fourth silicon oxide film is preferably formed by plasma CVD, but may be formed by atmospheric pressure CVD using a $TEOS/O_3$ gas.

Since an interlayer insulating film 24 is of a layered structure having layered silicon oxide films (15, 16, 17, 18) having different characteristics, the advantages of the respective silicon oxide films join together. As a result, the surface of the interlayer insulating film 24 is flattened, and the resultant interlayer insulating film 24 attains superior crack resistance and insulation.

A second Al interconnection 25 is formed on the interlayer insulating film 24. The second Al interconnection 25 is connected to the stepped and convex pattern 13 which is the first Al interconnection.

FIGS. 2A–2F are sectional views showing a process of manufacturing the semiconductor device in FIG. 1.

Figure 2A:
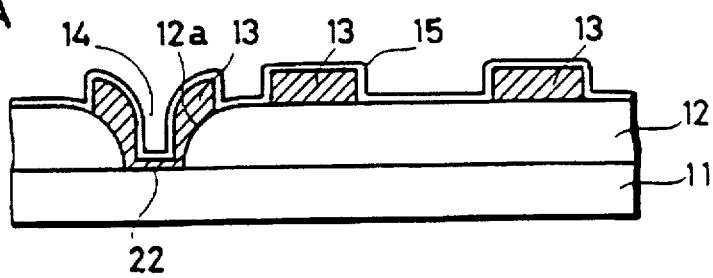
FIGS. 2A–2F are sectional views showing a manufacturing process of the semiconductor device shown in FIG. 1.

Referring to FIG. 2A, an insulating film 12 is formed on a semiconductor substrate 11 on which elements (not shown) are formed. The insulating film 12 is provided with a contact hole 12a for exposing a junction 22 on the semiconductor substrate 11. Sputtering is made entirely over the surface of the semiconductor substrate 11 and an aluminum film is deposited thereon. The aluminum film is patterned into a prescribed form, and then the step of the aluminum interconneciton, the stepped pattern 13 is formed. A plasma oxide film 15 is formed so as to cover the surface of the stepped pattern 13. The plasma oxide film 15 is deposited using a $SiH_4/N_2O$ gas or a $TEOS/O_2$ gas as a material gas at a temperature about in the range of 300°–400° C., under a pressure about in the range of 0.1–10 Torr, until the film grows as thick as 0.1–0.2 μm.

Figure 2B:
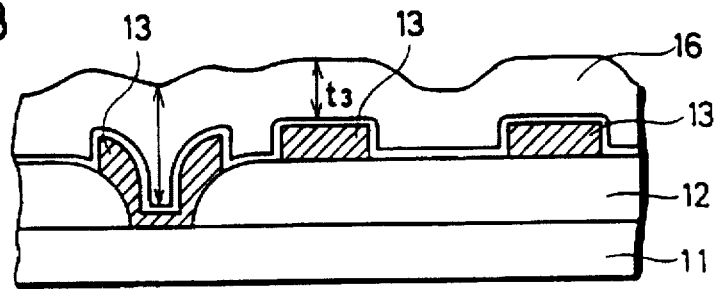

Referring to FIG. 2B, an atmospheric pressure TEOS oxide film 16 is formed entirely over the surface of the semiconductor substrate 11 by CVD, using TEOS and ozone at a temperature in the range of 350°–450° C., under an atmospheric pressure (more than 760 Torr) or a quasi atmospheric pressure (700–760 Torr). The ratio of $O_3$/TEOS is preferably more than 6. The atmospheric pressure TEOS oxide film 16 is deposited in the concave of the stepped pattern 13 until the film thickness ($t_3$) grows as thick as 1.0–1.5 μm.

Now, description will be given on the reason why the atmospheric pressure TEOS oxide film 16 is superior in step coverage and filling of recesses.

Figure 3:
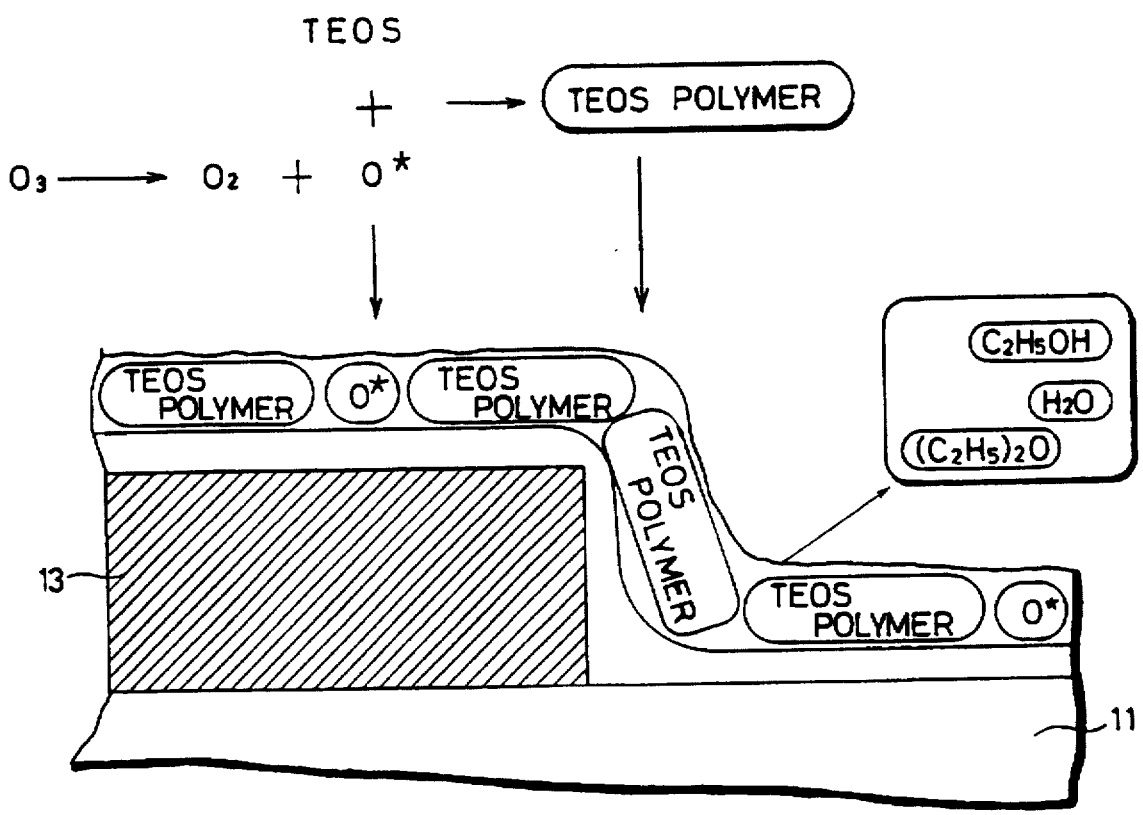
FIG. 3 is a view schematically showing how a silicon oxide film is formed by atmospheric pressure CVD using

FIG. 3 is a view schematically showing how an atmospheric pressure TEOS oxide film is formed by atmospheric pressure CVD using $TEOS/O_3$. In the reaction of TEOS and $O_3$, the ozone is first decomposed by heat and generates oxygen radicals. The polymerization reaction of the oxygen radicals and TEOS takes place in a vapor phase. An intermediate produced by the polymerization reaction is considered to be a low molecular weight TEOS polymer formed of coupled n pieces of TEOS. The TEOS polymers and oxygen radicals produced in the vapor phase are transported to the surface of the semiconductor substrate having the stepped pattern 13, and a further polymerization reaction takes place on the surface, resulting in a film. The TEOS polymers possesses characteristics similar to liquid, and gather at the recessed portion as the flow of water. The surface thereof attains a smooth form. This is the reason why the atmospheric pressure TEOS oxide film is superior in step coverage and filling of recesses.

Figure 2C:
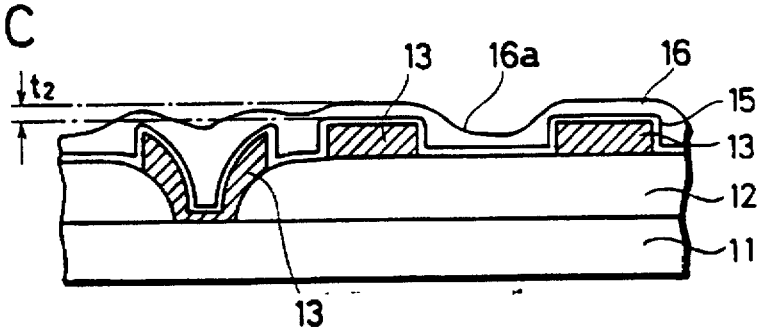

Referring to FIG. 2C, the atmospheric TEOS oxide film 16 is etched back until its film thickness ($t_2$) at the stepped portion of the stepped pattern 13 is less than 0.5 μm.

Figure 2D:
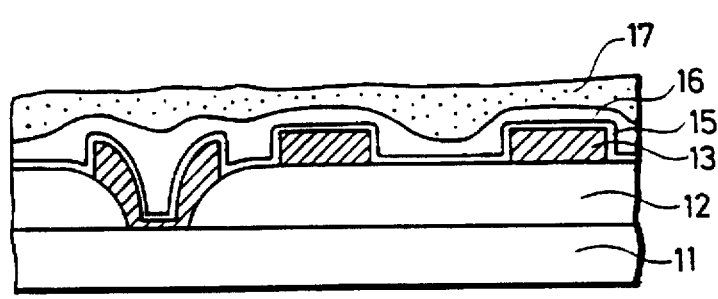

Referring to FIG. 2D, an SOG film 17 is applied onto the atmospheric pressure TEOS oxide film 16 so as to fill in the recessed portion 16a existing on the surface of the etched atmospheric pressure TEOS oxide film 16, and annealing is formed thereon.

Figure 2E:
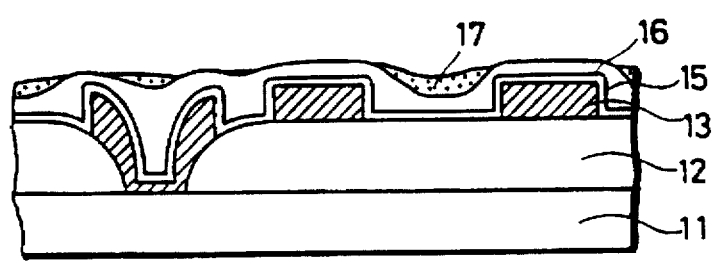

Now, referring to FIGS. 2D and 2E, the SOG film 17 is etched so that the SOG film 17 is left only in the recessed portion 16a.

Figure 2F:
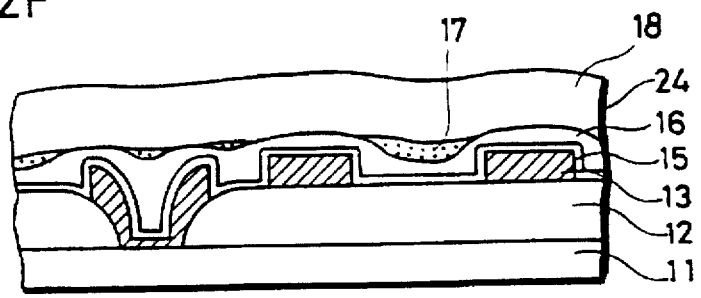

Referring to FIG. 2F, a plasma oxide film 18 is formed on the semiconductor substrate 11 including the atmospheric pressure TEOS oxide film 16 and the SOG film 17. The formation of the plasma oxide film 18 is performed under conditions identical to the conditions under which the plasma oxide film 15 is formed in FIG. 2A.

The plasma oxide film 18 is deposited so that the total film thickness of the interlayer insulating film 24 becomes approximately 0.9 μm. The semiconductor device shown in FIG. 1 is obtained by forming a second Al interconnection on the interlayer insulating film 24.

Referring to FIGS. 2A and 2B, forming the plasma oxide film 15 to cover the surface of the stepped pattern allows the expansion of the aluminum interconnection which is the stepped pattern 13 to be suppressed. Cracks in the atmospheric pressure TEOS oxide film 16 can be thus prevented.

Referring to FIGS. 2B and 2C, the atmospheric pressure TEOS oxide film 16 can be deposited thicker than conventional ones i.e. to a thickness between 1.0–1.5 μm (conventionally about 0.6–0.8 μm), because the atmospheric pressure TEOS oxide film 16 is etched back later. The surface of the atmospheric pressure TEOS oxide film 16 is therefore further flattened as compared to the conventional ones.

Referring to FIGS. 2D and 2E, when the SOG film 17 (upon its annealing)is formed, the film thickness of the atmospheric pressure TEOS oxide film 16 is less than 0.5 μm, so that no crack will be produced on the atmospheric pressure TEOS oxide film 16.

As described above, in the present embodiment, the insulation and crack resistance of the interlayer insulating film are tremendously improved compared to the conventional ones. Also, the film thickness of the atmospheric pressure TEOS oxide film can be formed to be thicker than conventional, so that the interlayer insulating film is further flattened.

Although in the above-described embodiment, TEOS is used as the organic silicon, the present invention is by no means limited thereto and it is to be noted that similar effects can be obtained if tetra-methyl-ortho-silicate (TMOS), tetra-propyl-ortho-silicate (TPOS) and polysiloxane polymers such as hexa-methyl-di-siloxane (HMDS), octa-methyl-cyclo-tetra-siloxane (OMCTS) are used. Although in the above-described embodiment, the organic silicon is independently used, the present invention is not limited thereto and trimethyl-borate (TMB), triethylborate (TEB), tri-n-propyl-borate (TnPB), trimethylphosphate (TMPO), and trimethyl-phosphite (TMP) may be added.

Also, in the above-described embodiment, the plasma oxide film is formed as the fourth silicon oxide film, but the invention is by no means limited, and an atmospheric pressure TEOS oxide film or a phosphorous glass film formed by atmospheric pressure CVD or low pressure CVD using $SiH_4/PH_3/O_2$, etc. as a material gas may be used. In the above-described embodiment, the cases have been described in which the second silicon film is an atmospheric pressure TEOS oxide film formed by atmospheric pressure CVD, but the second silicon oxide film may be formed by low pressure CVD. The TEOS oxide film produced by atmospheric pressure CVD is, however, superior in various points as compared to the one produced by low pressure CVD. In the following, a result of comparison between both films will be described.

Figure 4A:
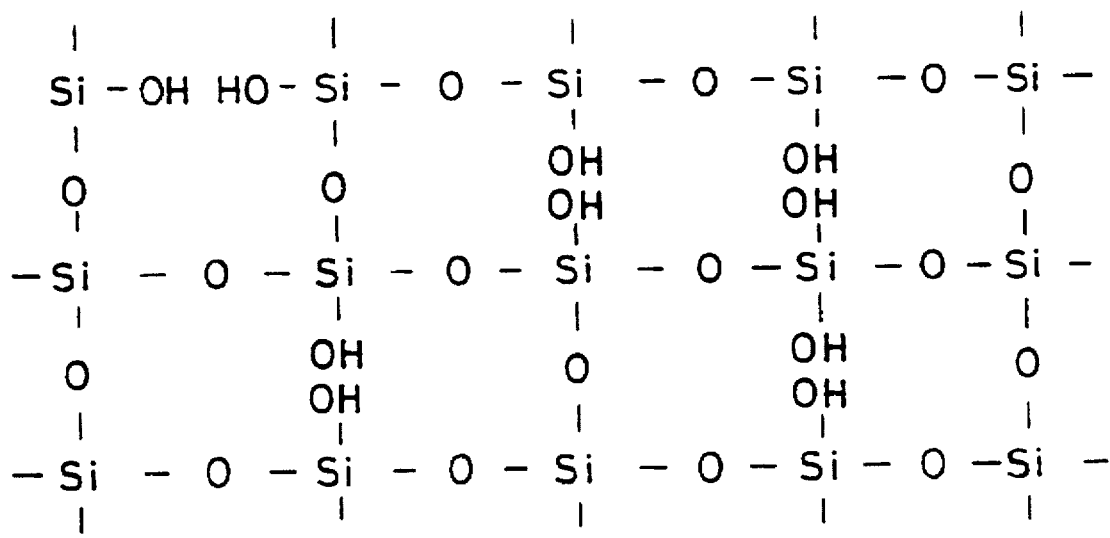
FIG. 4A is a representation showing the chemical structure of a TEOS oxide film formed by low pressure CVD.
Figure 4B:
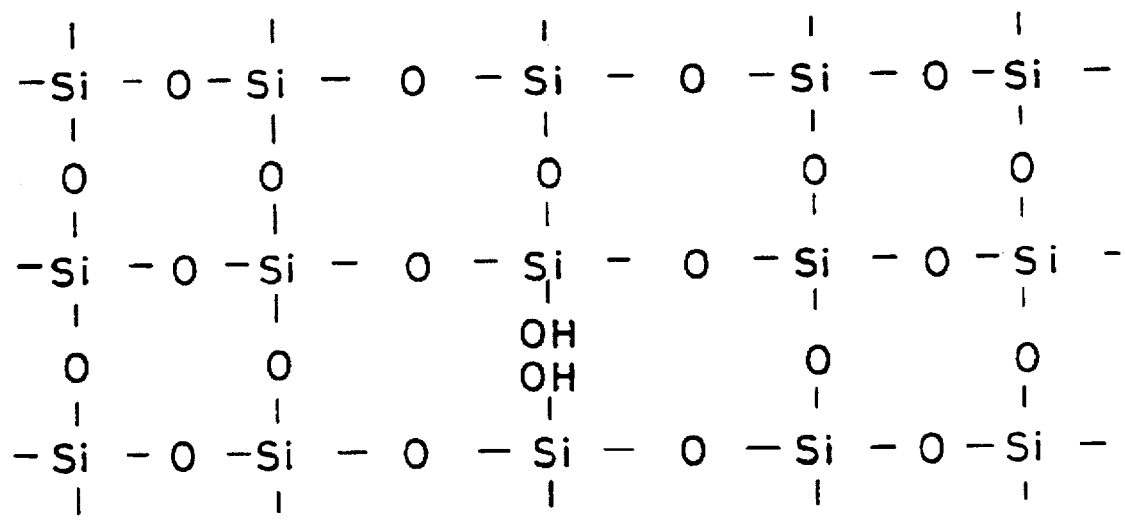
FIG. 4B is a representation showing the chemical structure of a TEOS oxide film formed by atmospheric CVD.

FIG. 4A represents the chemical structure of a TEOS oxide film produced by low pressure (100 Torr) CVD, and FIG. 4B represents the chemical structure of a TEOS oxide film produced by atmospheric pressure CVD. As can be clearly seen from the figures, in the atmospheric TEOS oxide film, less SiOH bonds are observed than in the low pressure TEOS oxide film. The atmospheric pressure TEOS oxide film has therefore a molecular volume larger than that of the low pressure TEOS oxide film. A polymer produced by atmospheric pressure CVD bears a closer resemblance to liquid than a polymer produced by low pressure CVD does.

Consequently, referring to FIG. 3, a film formed by atmospheric CVD provides superior step coverage compared to the one formed by low pressure CVD.

Also, comparison is made between the atmospheric pressure CVD.TEOS oxide film and the low pressure CVD.TEOS oxide film as to the shrinkage factors of the films. As a result of annealing both films at 450° C. in a nitrogen atmosphere for 30 minutes, a film shrinkage factors of 20% is observed on the low pressure CVD.TEOS oxide film and a film shrinkage factor of 1% on the atmospheric pressure CVD.TEOS oxide film.

Then, comparison is made between both films in crack resistance. The result will be shown in Table 1.

TABLE 1

| film thickness (μm) | 0.1 | 0.3 | 0.5 | 0.8 | 1.0 | 1.2 | 1.5 | 2.0 |
|---|---|---|---|---|---|---|---|---|
| low pressure CVD.TEOS oxide film | o | o | o | x | x | x | — | — |
| atmospheric pressure CVD.TEOS oxide film | o | o | o | o | o | o | o | x | o ... no crack
x ... cracks formed

As is apparent from Table 1, the atmospheric pressure CVD.TEOS oxide film is superior to the low pressure CVD.TEOS oxide film in crack resistance. A TEOS oxide film having more than 1.5 μm film thickness was not obtained by low pressure CVD after all.

Figure 5:
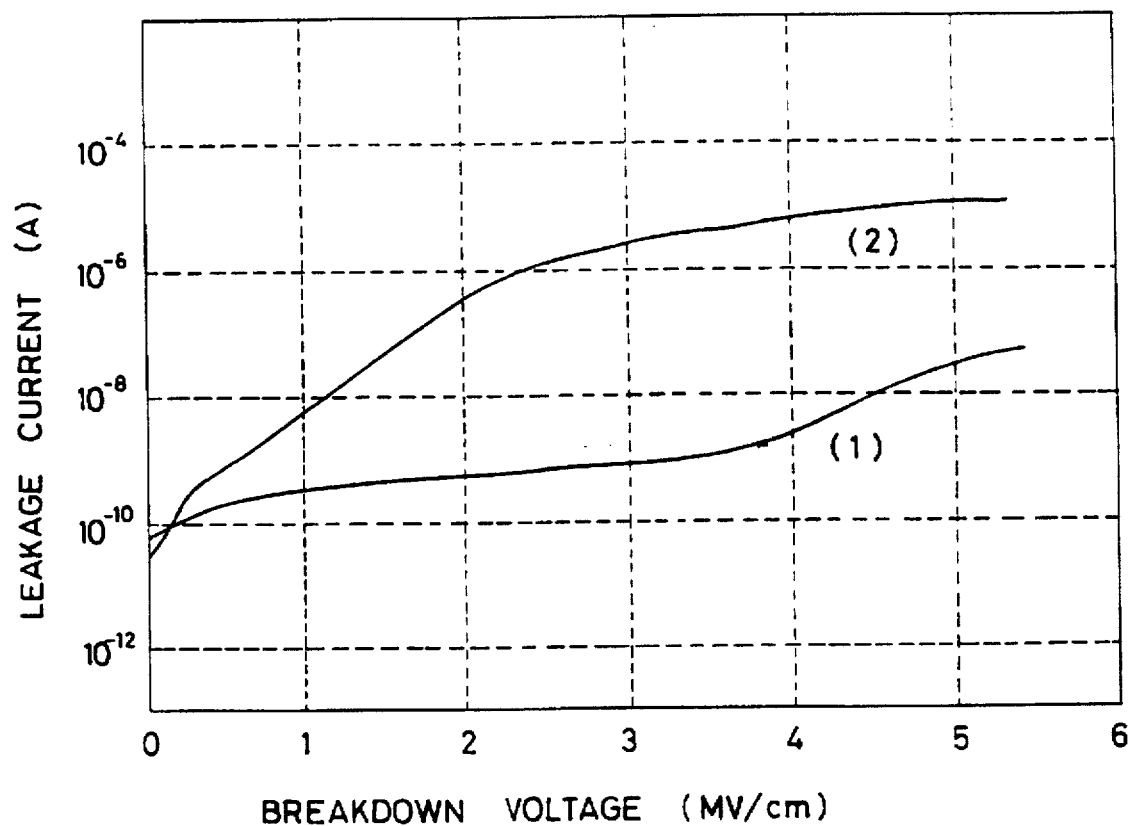
FIG. 5 is a graphic representation showing a comparison in current leakage between an atmospheric CVD.TEOS oxide film and a low pressure CVD-TEOS oxide film.
Figure 6A:
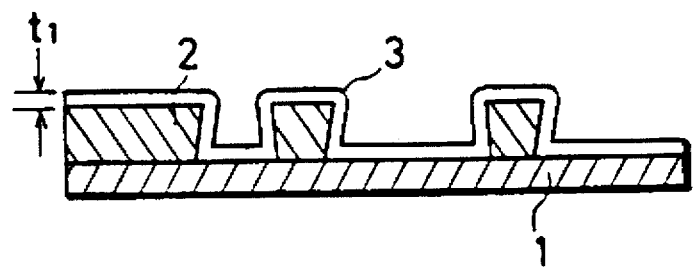
FIGS. 6A–6C are sectional views showing a conventional process of manufacturing an interlayer insulating film.
Figure 6B:
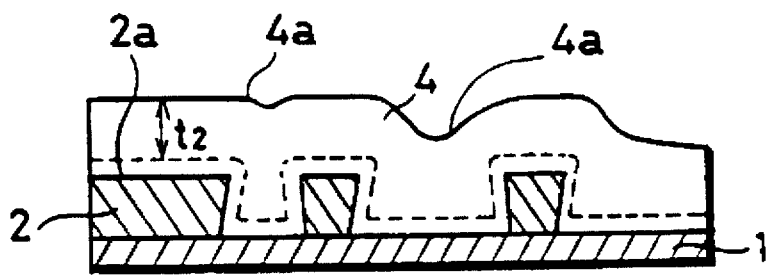
Figure 6C:
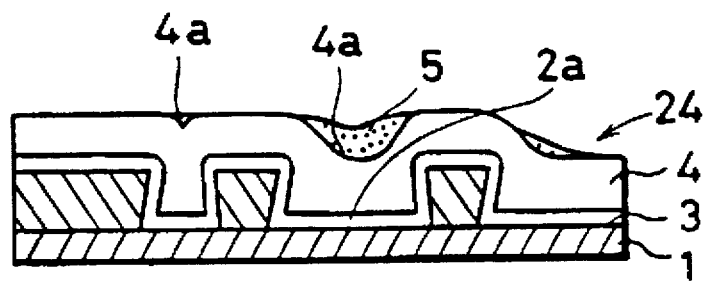
Figure 7:
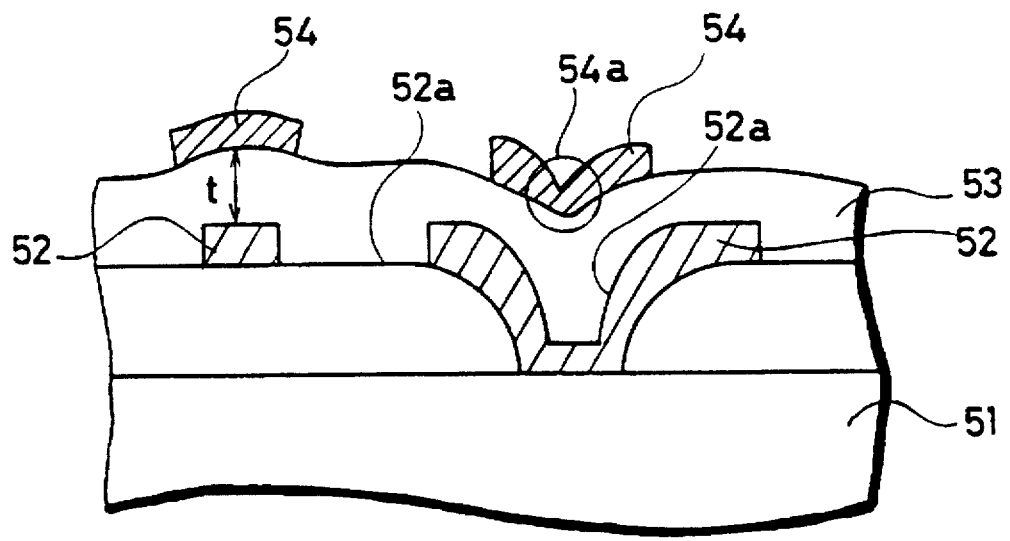
FIG. 7 is a view for illustrating problems associated with forming a second interconnection-pattern on a conventional interlayer insulating film with a surface not flattened.
Figure 8:
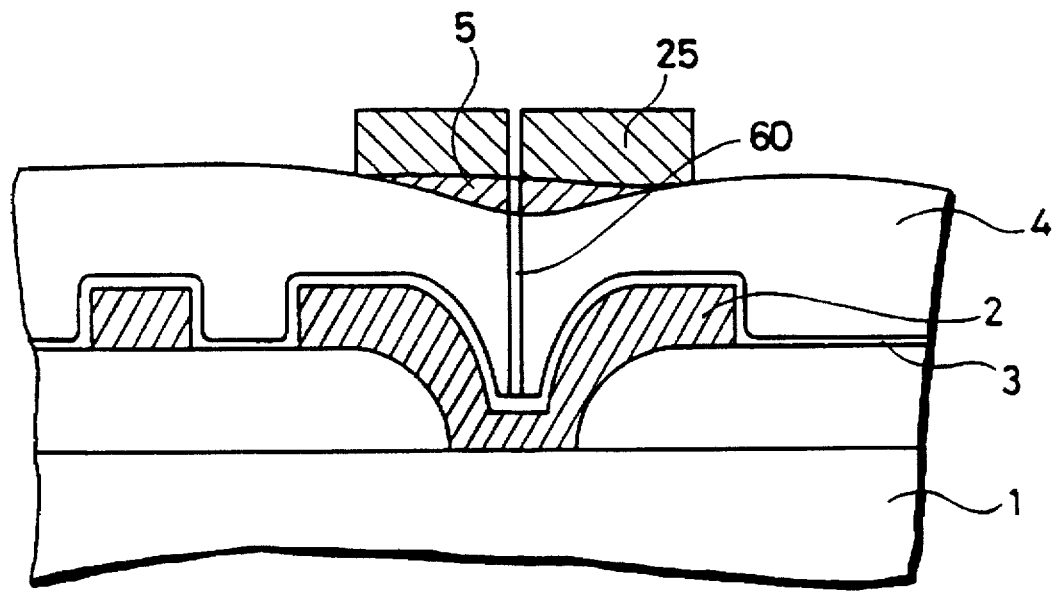
FIG. 8 is a view for illustrating problems associated with forming a second Al interconnection on a conventional interlayer insulating film with a surface flattened with SOG film.

FIG. 5 is a graphic representation showing the result of current leakage observed on each of the films.

A curve (1) represents the case of the atmospheric pressure CVD.TEOS oxide film, and a curve (2) represents the low pressure CVD-TEOS oxide film. The atmospheric CVD.TEOS oxide film indicated lower leakage current than the low pressure CVD.TEOS oxide film.

As described above, in accordance with a semiconductor device of the present invention, an interlayer insulating film is of a multilayered structure formed of multilayers of silicon oxide films having different characteristics (in flatness and crack resistance), and, therefore, advantages brought about by the respective silicon oxide film are combined. As a result, the surface of the interlayer insulating film is flattened, and the film is superior in crack resistance.

Also, by a method of manufacturing a semiconductor device in accordance with the present invention, an interlayer insulating film superior in crack resistance and having a flat surface is produced, and, therefore, a semiconductor device having high reliability can be produced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, which method comprises:

forming a stepped pattern over a semiconductor substrate;

depositing a first silicon oxide film over said semiconductor substrate so that the as deposited first silicon oxide film covers the surface of said stepped pattern but does not completely fill the recessed portions of said stepped pattern;

forming a second silicon oxide film on said as deposited first silicon oxide film so as to substantially fill in the recessed portions of said stepped pattern and to cover said stepped pattern and said first silicon oxide film;

reducing substantially the entire surface of said second silicon oxide film in thickness while maintaining complete coverage of said stepped pattern and said first silicon oxide film; and forming a third silicon oxide film on said reduced second silicon oxide film including filling recessed portions existing on the surface of said reduced second silicon oxide film.

2. The method according to claim 1, wherein the first silicon oxide film has superior crack resistance as compared with the second silicon oxide film, and the second silicon oxide film has superior recess filling capability as compared with the first silicon oxide film.

3. The method according to claim 1, further comprising forming a fourth silicon oxide film on said third silicon oxide film.

4. The method according to claim 1, wherein said first silicon oxide film is formed by chemical vapor deposition, and said third silicon oxide film is formed by applying a spin on glass film over said semiconductor substrate and has superior recess filling capability as compared with the first silicon oxide film.

5. The method according to claim 4, further comprising:

forming a fourth silicon oxide film on said third silicon oxide film.

6. The method according to claim 1, wherein said second silicon oxide film is reduced in thickness to less than 0.5 μm in the stepped portion of said stepped pattern.

7. The method according to claim 6, further comprising forming a fourth-silicon oxide film on said third silicon oxide film.

8. The method according to claim 1, comprising forming a stepped pattern in a through hole in an insulating layer on the semiconductor substrate.

9. The method according to claim 1, wherein the first silicon oxide film has a thickness of about 0.1 to about 0.2 μm.

10. A method of manufacturing a semiconductor device, which method comprises:

forming a stepped pattern over a semiconductor substrate;

depositing a first silicon oxide film over said semiconductor substrate so that the as deposited first silicon oxide film covers the surface of said stepped pattern but does not completely fill the recessed portions of said stepped pattern;

forming a second silicon oxide film on said as deposited first silicon oxide film so as to substantially fill in the recessed portions of said stepped pattern and to cover said stepped pattern and said first silicon oxide film;

etching substantially the entire surface of said second silicon oxide film to reduce its thickness while maintaining complete coverage of said stepped pattern and said first silicon oxide film; and forming a third silicon oxide film on said reduced second silicon oxide film including filling recessed portions existing on the surface of said reduced second silicon oxide film.

11. The method according to claim 10, wherein the first silicon oxide film has superior crack resistance as compared with the second silicon oxide film and the second silicon oxide film has superior recess filling capability as compared with the first silicon oxide film.

12. The method according to claim 10, further comprising forming a fourth silicon oxide film on said third silicon oxide film.

13. The method according to claim 10, wherein said first silicon oxide film is formed by chemical vapor deposition.

14. The method according to claim 17, further comprising forming a fourth silicon oxide film on said third silicon oxide film.

15. The method according to claim 10, wherein said second silicon oxide film is etched until it has a thickness less than 0.5 μm in the stepped portion of said stepped pattern.

16. The method according to claim 15, further comprising forming a fourth silicon oxide film on said third silicon oxide film.

17. The method according to claim 10, wherein the first silicon oxide film has a thickness of about 0.1 to about 0.2 μm.

18. A method of manufacturing a multiple layer interlayer insulating film comprising:

(1) a first insulating film overlying a stepped pattern formed over an insulator;

(2) a second silicon oxide insulating film completely covering said first insulating film and substantially filling recessed portions of said stepped pattern; and (3) a third silicon oxide insulating film at least filling in recesses in the upper surface of said second silicon oxide insulating film so that the second and third silicon oxide insulating films present a substantially flat composite upper surface, said method comprising:

depositing a first insulating film overlying a stepped pattern formed on an insulator so that the first as deposited insulating film covers the surface of said stepped pattern but does not completely fill the recessed portions of said stepped pattern;

forming said second silicon oxide insulating film on the as deposited first insulating film to have a first thickness;

reducing substantially the entire said first thickness of said second silicon oxide insulating film to a second thickness while maintaining complete coverage of said stepped pattern and said first insulating film; and forming said third silicon oxide insulating film on said reduced second silicon oxide insulating film including filling in recesses in the upper surface of said second silicon oxide insulating film so that the second and third silicon oxide insulating films present a substantially flat composite upper surface.

19. The method according to claim 18, wherein said first insulating film has a crack resistance characteristic superior to that of said second silicon oxide insulating film, and said second silicon oxide insulating film has a recess filling characteristic superior to that of said first insulating film.

20. The method according to claim 18, whereby a tendency of said second and third silicon oxide insulating films to form cracks is reduced.

21. The method according to claim 20, wherein said second and third silicon oxide insulating films exhibit a difference in shrinkage factors therebetween, and the second thickness of the second silicon oxide insulating film corresponds to a maximum magnitude of force to be imparted to said third silicon oxide insulating film as a result of said shrinkage factor difference before cracking occurs.

22. The method according to claim 18, wherein
said second silicon oxide film is etched to the second thickness in the stepped portion of said stepped pattern.

23. The method according to claim 18, further comprising
forming a fourth silicon oxide film on said third silicon oxide film.

24. The method according to claim 18, wherein the first silicon oxide film has a thickness of about 0.1 to about 0.2 µm.

25. A method of manufacturing a semiconductor device, which method comprises:
forming a stepped pattern over a semiconductor substrate;
depositing a first silicon oxide film over said semiconductor substrate so that the as deposited first silicon oxide film has a surface in faithful conformity with the form of said stepped pattern thereunder;
forming a second silicon oxide film on said as deposited first silicon oxide film so as to substantially fill in the recessed portions of said stepped pattern and to cover said stepped pattern and said first silicon oxide film;
reducing substantially the entire surface of said second silicon oxide film in thickness while maintaining complete coverage of said stepped pattern and said first silicon oxide film; and
forming a third silicon oxide film on said reduced second silicon oxide film including filling recessed portions existing on the surface of said reduced second silicon oxide film.

26. A method of manufacturing a semiconductor device, which method comprises:
forming a stepped pattern over a semiconductor substrate;
depositing a first silicon oxide film over said semiconductor substrate so that the as deposited first silicon oxide film has a surface in faithful conformity with the form of said stepped pattern thereunder;
forming a second silicon oxide film on said as deposited first silicon oxide film so as to substantially fill in the recessed portions of said stepped pattern and to cover said stepped pattern and said first silicon oxide film;
etching substantially the entire surface of said second silicon oxide film to reduce its thickness while maintaining complete coverage of said stepped pattern and said first silicon oxide film; and
forming a third silicon oxide film on said reduced second silicon oxide film including filling recessed portions existing on the surface of said reduced second silicon oxide film.

27. A method of manufacturing a multiple layer interlayer insulating film comprising:
(1) a first insulating film overlying a stepped pattern formed over an insulator;
(2) a second silicon oxide insulating film completely covering said first insulating film and substantially filling recessed portions of said stepped pattern; and
(3) a third silicon oxide insulating film at least filling in recesses in the upper surface of said second silicon oxide insulating film so that the second and third silicon oxide insulating films present a substantially flat composite upper surface,
said method comprising:
depositing a first insulating film overlying a stepped pattern formed on an insulator so that the as deposited first silicon oxide film has a surface in faithful conformity with the form of said stepped pattern thereunder;
forming said second silicon oxide insulating film on the as deposited first insulating film to have a first thickness;
reducing substantially the entire said first thickness of said second silicon oxide insulating film to a second thickness while maintaining complete coverage of said stepped pattern and said first insulating film; and
forming said third silicon oxide insulating film on said reduced second silicon oxide insulating film including filling in recesses in the upper surface of said second silicon oxide insulating film so that the second and third silicon oxide insulating films present a substantially flat composite upper surface.

* * * * *